United States Patent
Dhakshinamurthy et al.

(10) Patent No.: US 8,397,018 B2
(45) Date of Patent: Mar. 12, 2013

(54) SYSTEMS AND METHODS FOR IMPLEMENTING A PROGRAMMING SEQUENCE TO ENHANCE DIE INTERLEAVE

(75) Inventors: Krishnamurthy Dhakshinamurthy, Bangalore (IN); Damian Yurzola, Santa Clara, CA (US); Rajeev Nagabhirava, Santa Clara, CA (US); Oren Shtrasberg, Ashodod (IL)

(73) Assignee: SanDisk Technologies Inc., Plano, TX (US)

( * ) Notice: Subject to any disclaimer, the term of this patent is extended or adjusted under 35 U.S.C. 154(b) by 147 days.

(21) Appl. No.: 12/979,686

(22) Filed: Dec. 28, 2010

(65) Prior Publication Data

US 2012/0030412 A1 Feb. 2, 2012

Related U.S. Application Data

(63) Continuation of application No. PCT/US2010/061717, filed on Dec. 22, 2010.

(30) Foreign Application Priority Data

Jul. 30, 2010 (IN) .......................... 2176/MUM/2010

(51) Int. Cl.
*G06F 12/00* (2006.01)

(52) U.S. Cl. ....................................... 711/103; 711/170
(58) Field of Classification Search .................. None
See application file for complete search history.

(56) References Cited

U.S. PATENT DOCUMENTS

| | | | | |
|---|---|---|---|---|
| 2006/0239080 | A1* | 10/2006 | Li | 365/185.22 |
| 2008/0158979 | A1* | 7/2008 | Kamei et al. | 365/185.19 |
| 2009/0307413 | A1* | 12/2009 | Chu | 711/103 |
| 2010/0172179 | A1* | 7/2010 | Gorobets et al. | 365/185.09 |

OTHER PUBLICATIONS

International Search Report for PCT/US2010/061717 mailed Apr. 14, 2011, 5 pgs.
Written Opinion for PCT/US2010/061717 mailed Apr. 14, 2011, 7 pgs.

* cited by examiner

*Primary Examiner* — Shawn X Gu
(74) *Attorney, Agent, or Firm* — Brinks Hofer Gilson & Lione (57) ABSTRACT

Systems and methods for sequentially writing data to a memory device such as a universal serial bus (USB) memory device are disclosed. A system controller of a memory device including a first die and a second die, each of the first die and the second die including a plurality of pages, writes a first portion of a set of data to a lower page of a second die. The system controller then writes a second portion of the set of data to an upper page of the second die after writing the first portion of the set of data to the lower page of the second die.

12 Claims, 9 Drawing Sheets

SYSTEMS AND METHODS FOR IMPLEMENTING A PROGRAMMING SEQUENCE TO ENHANCE DIE INTERLEAVE

RELATED APPLICATIONS

The present application is a continuation of PCT Application No. PCT/US2010/61717, filed Dec. 22, 2010, which claims priority to Indian Patent Application No. 2176/MUM/2010, filed Jul. 30, 2010, the entirety of each of which are hereby incorporated by reference.

TECHNICAL FIELD

This application relates generally to managing data in a memory system. More specifically, this application relates to a memory system implementing an improved programming sequence to enhance die interleave in re-programmable non-volatile semiconductor flash memory.

BACKGROUND

When writing data to multiple die in a conventional flash memory system, a system controller normally utilizes a programming sequence in which during a transaction, data is written to an upper page of a die before data is written to a lower page of the same die. Because of the amount of time for a cache of a die to release after writing data to an upper page of the die, a system controller must often wait idle for a substantial period of time during a transaction before the system controller may execute a write to a lower page of the die.

BRIEF SUMMARY

In order to address the need to reduce the amount of time that a system controller must wait idle during a transaction, methods and systems are disclosed herein for sequentially writing data to a memory device that reduces an amount of time that a system controller must wait for a cache of the memory device to release by writing data to a lower page of a die during a transaction prior to writing data to an upper page of the die.

According to one aspect, a method for sequentially writing data to a memory device such as a universal serial bus (USB) memory device is disclosed. In a memory device comprising a first die and a second die, each of the first die and the second die comprising a plurality of pages, a first set of data is received. The first set of data is written to one or more pages of the first die and the second die.

A second set of data is received after the first set of data is written to the one or more pages of the first die and the second die. A first portion of the second set of data is written to a lower page of the second die and a second portion of the second set of data is written to an upper page of the second die after writing the first portion of the second set of data to a lower page of the second die.

In some implementations, a third portion of the second set of data may be written to an upper page of the first die prior to writing the first portion of the second set of data to the lower page of the second die. Further, a fourth portion of the second set of data may be written to a lower page of the first die after writing the second portion of the second set of data to the upper page of the second die.

According to another aspect, another method for sequentially writing data to a memory device such as a USB memory device is disclosed. In a memory device comprising a first die and a second die, each of the first die and the second die comprising a plurality of pages, a first portion of a set of data is written to an upper page of the first die. A second portion of the set of data is written to a lower page of the second die after the first portion of the set of data is written to the upper page of the first die. A third portion of the set of data is written to an upper page of the second die after the second portion of the set of data is written to the lower page of the second die. A fourth portion of the set of data is written to a lower page of the first die after the third portion of the set of data is written to the upper page of the second die.

According to a further aspect, a memory device such as a USB memory device comprising a communication interface, a memory unit, and a processor is disclosed. The memory unit comprises a first die and a second die, each of the first die and the second die comprising a plurality of pages.

The processor sequentially writes data received over the communication interface to one or more pages of the first die and the second die. The processor is configured to receive a first set of data over the communication interface and write the first set of data to one or more pages of the first die and the second die. The processor is configured to receive a second set of data over the communication interface after writing the first set of data to the one or more pages of the first die and the second die. The processor is further configured to write a first portion of the second set of data to a lower page of the second die and to write a second portion of the second set of data to an upper page of the second die after writing the first portion of the second set of data to the lower page of the second die.

Other features and advantages will become apparent upon review of the following drawings, detailed description and claims. Additionally, other embodiments are disclosed, and each of the embodiments can be used alone or together in combination. The embodiments will now be described with reference to the attached drawings.

DETAILED DESCRIPTION

Figure 1:
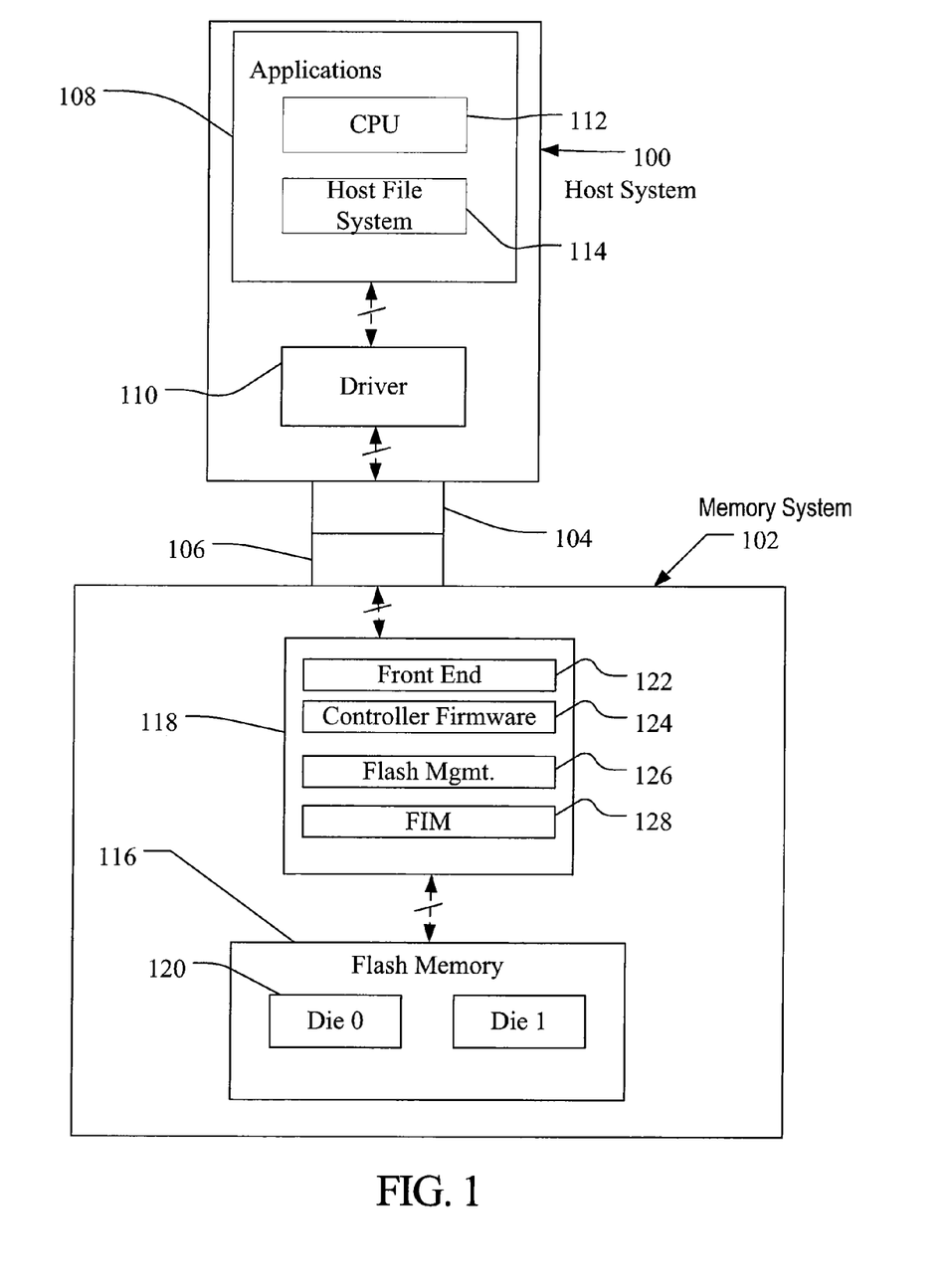
FIG. 1 illustrates a host connected with a memory system having a multi-bank non-volatile memory containing multiple die.

A flash memory system suitable for use in implementing aspects of the invention is shown in FIGS. 1-8b. A host system 100 of FIG. 1 stores data into and retrieves data from a memory system 102. The memory system may be flash memory embedded within the host, such as in the form of a solid state disk (SSD) drive installed in a personal computer. Alternatively, the memory system 102 may be in the form of a card that is removably connected to the host through mating parts 104 and 106 of a mechanical and electrical connector as illustrated in FIG. 1. A flash memory configured for use as an internal or embedded SSD drive may look similar to the schematic of FIG. 1, with the primary difference being the location of the memory system 102 internal to the host. SSD drives may be in the form of discrete modules that are drop-in replacements for rotating magnetic disk drives.

The host system 100 of FIG. 1 may be viewed as having two major parts, in so far as the memory system 102 is concerned, made up of a combination of circuitry and software. They are an applications portion 108 and a driver portion 110 that interfaces with the memory system 102. In a PC, for example, the applications portion 108 can include a processor 112 running word processing, graphics, control or other popular application software, as well as the file system 114 for managing data on the host 100. In a camera, cellular telephone or other host system that is primarily dedicated to perform a single set of functions, the applications portion 108 includes the software that operates the camera to take and store pictures, the cellular telephone to make and receive calls, and the like.

The memory system 102 of FIG. 1 may include non-volatile memory, such as flash memory 116, and a system controller 118 that both interfaces with the host 100 to which the memory system 102 is connected for passing data back and forth and controls the memory 116. The system controller 118 may convert between logical addresses of data used by the host 100 and physical addresses of the flash memory 116 during data programming and reading. The flash memory 116 may include any number of memory die 120 and two memory die are shown in FIG. 1 simply by way of illustration. Functionally, the system controller 118 may include a front end 122 that interfaces with the host system, controller logic 124 for coordinating operation of the memory 116, flash management logic 126 for internal memory management operations such as garbage collection, and one or more flash interface modules (FIMs) 128 to provide a communication interface between the controller with the flash memory 116.

Figure 2:
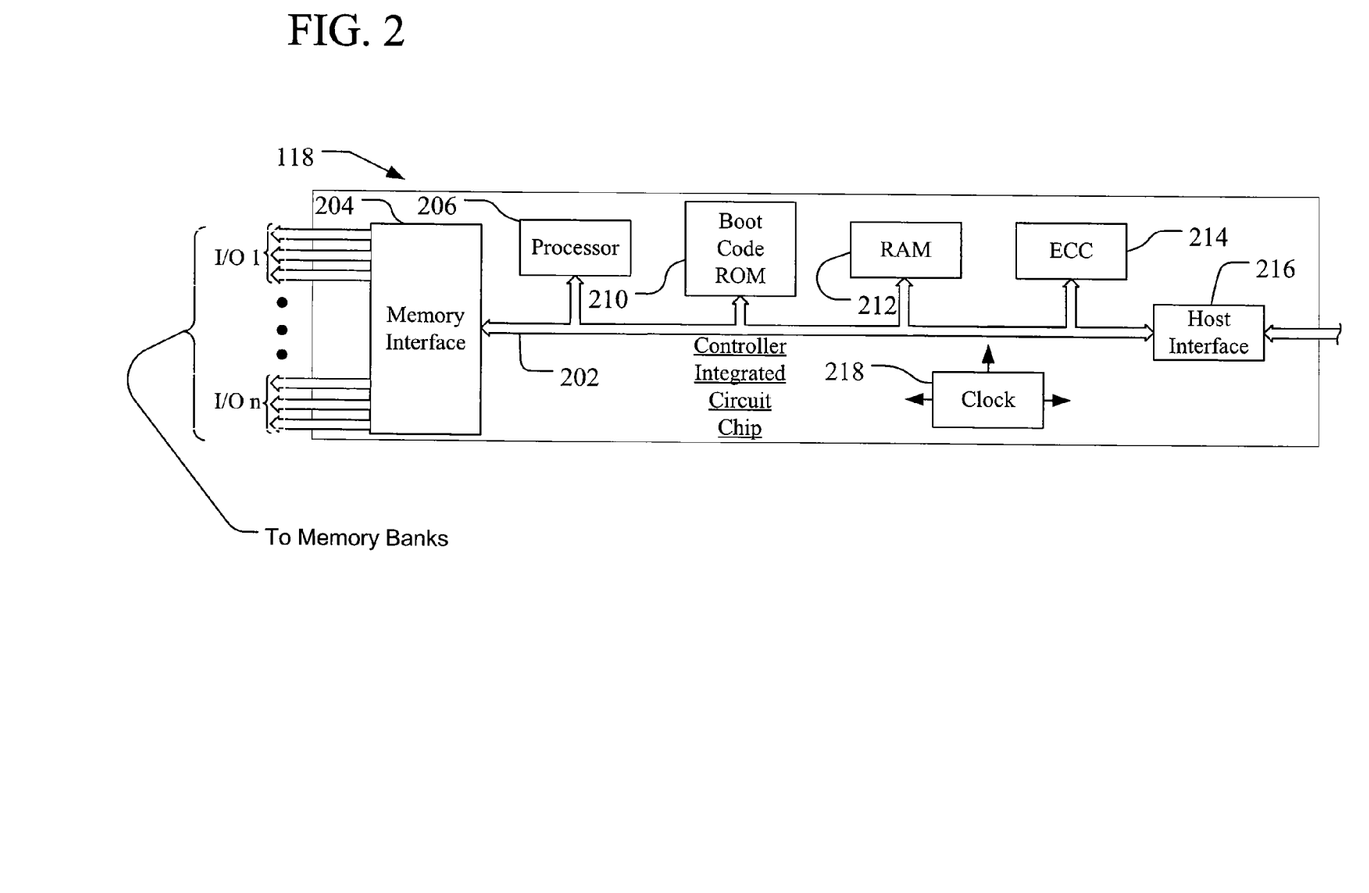
FIG. 2 is an example block diagram of an example flash memory system controller for use in the multiple die non-volatile memory of FIG. 1.

The system controller 118 may be implemented on a single integrated circuit chip, such as an application specific integrated circuit (ASIC) such as shown in FIG. 2. The processor 206 of the system controller 118 may be configured as a multi-thread processor capable of communicating separately with each of the respective memory banks 120 via a memory interface 204 having I/O ports for each of the respective banks 120 in the flash memory 116. The system controller 118 may include an internal clock 218. The processor 206 communicates with an error correction code (ECC) module 214, a RAM buffer 212, a host interface 216, and boot code ROM 210 via an internal data bus 202.

Figure 3:
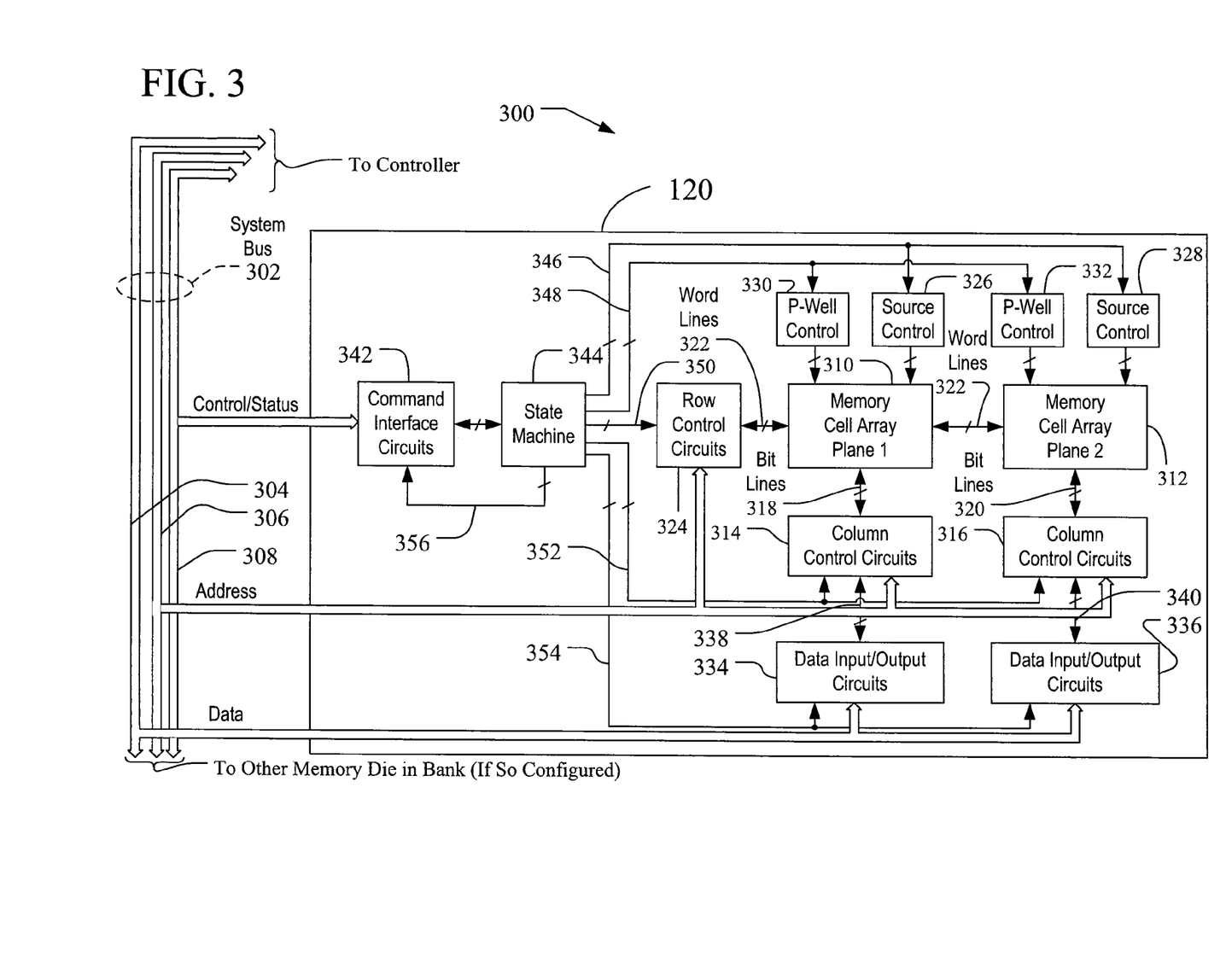
FIG. 3 is an example one flash memory bank suitable as one of the non-volatile memory banks illustrated in FIG. 1.

Each die 120 in the flash memory 116 may contain an array of memory cells organized into multiple planes. One of FIG. 3 shows such planes 310 and 312 for simplicity but a greater number of planes, such as four or eight planes, may instead be used. Alternatively, the memory cell array of a memory bank may not be divided into planes. When so divided, however, each plane has its own column control circuits 314 and 316 that are operable independently of each other. The circuits 314 and 316 receive addresses of their respective memory cell array from the address portion 306 of the system bus 302, and decode them to address a specific one or more of respective bit lines 318 and 320. The word lines 322 are addressed through row control circuits 324 in response to addresses received on the address bus 306. Source voltage control circuits 326 and 328 are also connected with the respective planes, as are p-well voltage control circuits 330 and 332. If the bank 300 is in the form of a memory chip with a single array of memory cells, and if two or more such chips exist in the system, data are transferred into and out of the planes 310 and 312 through respective data input/output circuits 334 and 336 that are connected with the data portion 304 of the system bus 302. The circuits 334 and 336 provide for both programming data into the memory cells and for reading data from the memory cells of their respective planes, through lines 338 and 340 connected to the planes through respective column control circuits 314 and 316.

Although the processor 206 in the system controller 118 controls the operation of the memory chips in each bank 120 to program data, read data, erase and attend to various housekeeping matters, each memory chip also contains some controlling circuitry that executes commands from the controller 118 to perform such functions. Interface circuits 342 are connected to the control and status portion 308 of the system bus 302. Commands from the controller 118 are provided to a state machine 344 that then provides specific control of other circuits in order to execute these commands. Control lines 346-354 connect the state machine 344 with these other circuits as shown in FIG. 3. Status information from the state machine 344 is communicated over lines 356 to the interface 342 for transmission to the controller 118 over the bus portion 308.

A NAND architecture of the memory cell arrays 310 and 312 is discussed below, although other architectures, such as NOR, can be used instead. An example NAND array is illustrated by the circuit diagram of FIG. 4, which is a portion of the memory cell array 310 of the memory bank 300 of FIG. 3. A large number of global bit lines are provided, only four such lines 402-408 being shown in FIG. 4 for simplicity of explanation. A number of series connected memory cell strings 410-424 are connected between one of these bit lines and a reference potential. Using the memory cell string 414 as representative, a plurality of charge storage memory cells 426-432 are connected in series with select transistors 434 and 436 at either end of the string. When the select transistors of a string are rendered conductive, the string is connected between its bit line and the reference potential. One memory cell within that string is then programmed or read at a time.

Figure 4:
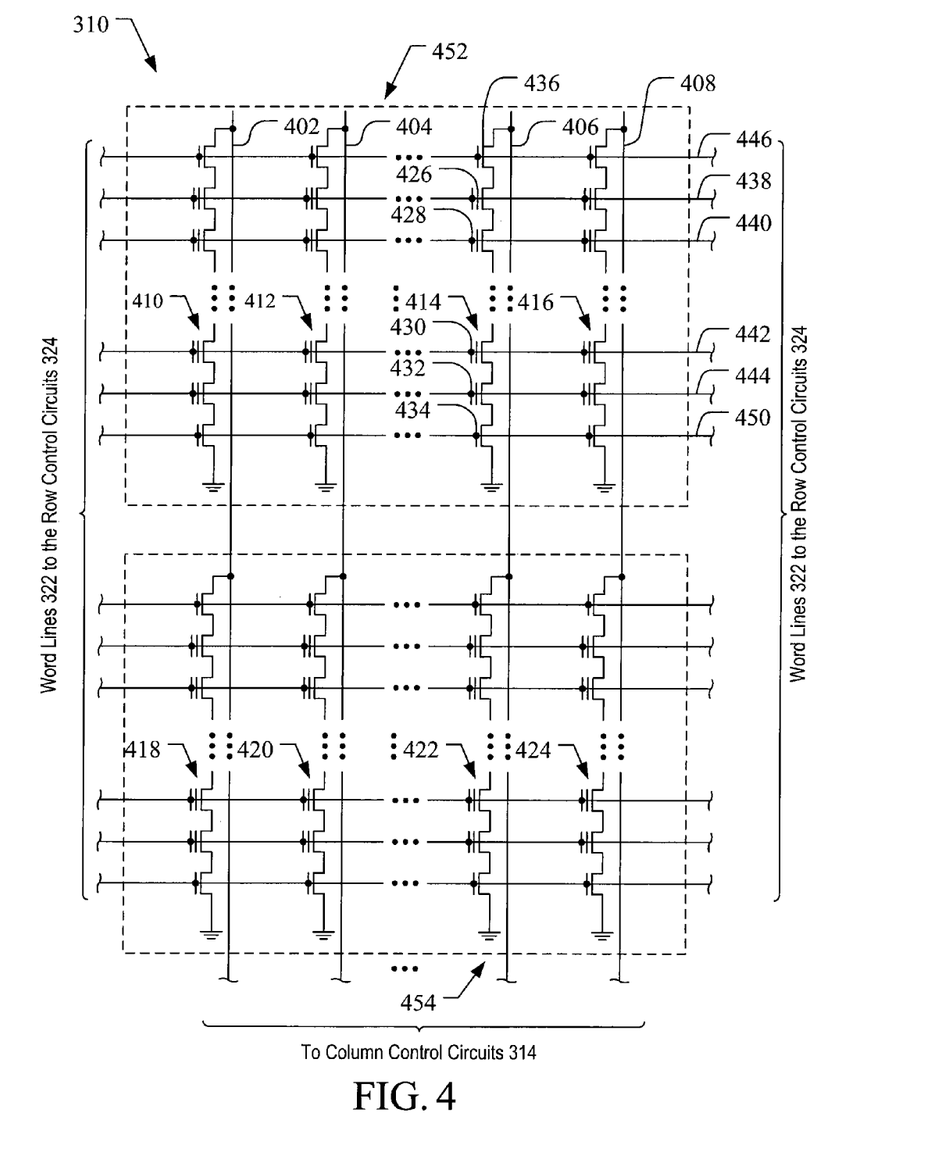
FIG. 4 is a representative circuit diagram of a memory cell array that may be used in the memory bank of FIG. 3.

Word lines 438-444 of FIG. 4 individually extend across the charge storage element of one memory cell in each of a number of strings of memory cells, and gates 446 and 450 control the states of the select transistors at each end of the strings. The memory cell strings that share common word and control gate lines 438-450 are made to form a block 452 of memory cells that are erased together. This block of cells contains the minimum number of cells that are physically erasable at one time. One row of memory cells, those along one of the word lines 438-444, are programmed at a time. Typically, the rows of a NAND array are programmed in a prescribed order, in this case beginning with the row along the word line 444 closest to the end of the strings connected to ground or another common potential. The row of memory cells along the word line 442 is programmed next, and so on, throughout the block 452. The row along the word line 438 is programmed last.

A second block 454 is similar, its strings of memory cells being connected to the same global bit lines as the strings in the first block 452 but having a different set of word and control gate lines. The word and control gate lines are driven to their proper operating voltages by the row control circuits 324. If there is more than one plane in the system, such as planes 1 and 2 of FIG. 3, one memory architecture uses common word lines extending between them. There can alternatively be more than two planes that share common word lines. In other memory architectures, the word lines of individual planes are separately driven.

The memory cells may be operated to store two levels of charge so that a single bit of data is stored in each cell. This is typically referred to as a binary or single level cell (SLC) memory. Alternatively, the memory cells may be operated to store more than two detectable levels of charge in each charge storage element or region, thereby to store more than one bit of data in each. This latter configuration is referred to as multi level cell (MLC) memory. Both types of memory cells may be used in a memory, for example binary flash memory may be used for caching data and MLC memory may be used for longer term storage. The charge storage elements of the memory cells are most commonly conductive floating gates but may alternatively be non-conductive dielectric charge trapping material.

Figure 5:
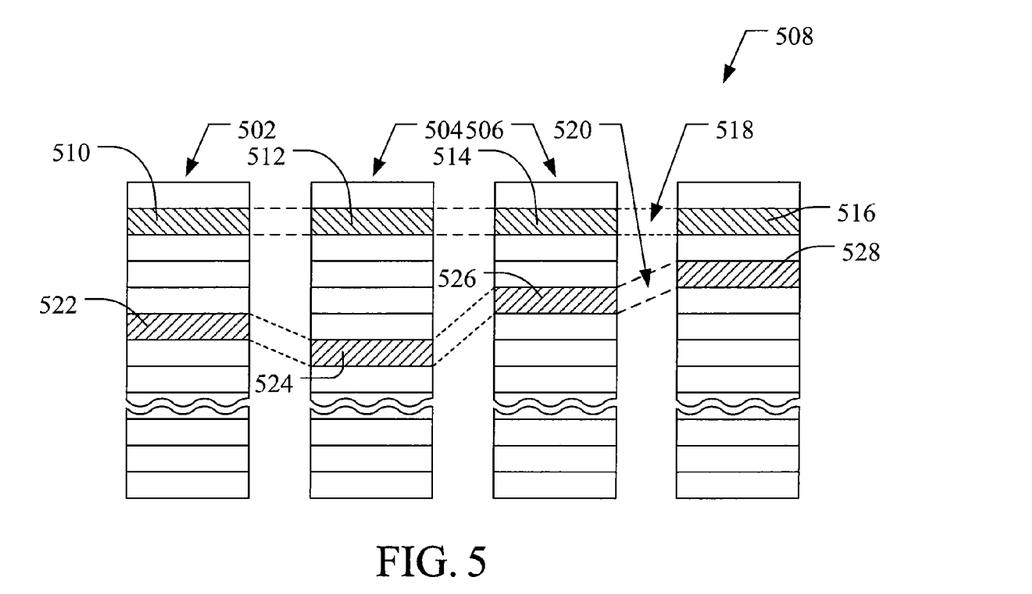
FIG. 5 illustrates an example physical memory organization of the memory bank of FIG. 3.

FIG. 5 conceptually illustrates a multiple plane arrangement showing four planes 502-508 of memory cells. These planes 502-508 may be on a single die, on two die (two of the planes on each die) or on four separate die. Of course, other numbers of planes, such as 1, 2, 8, 16 or more may exist in each die of a system. The planes are individually divided into blocks of memory cells shown in FIG. 5 by rectangles, such as blocks 510, 512, 514 and 516, located in respective planes 502-508. There can be dozens or hundreds of blocks in each plane.

As mentioned above, a block of memory cells is the unit of erase, the smallest number of memory cells that are physically erasable together. For increased parallelism, however, the blocks are operated in larger metablock units. One block from each plane is logically linked together to form a metablock. The four blocks 510-516 are shown to form one metablock 518. All of the cells within a metablock are typically erased together. The blocks used to form a metablock need not be restricted to the same relative locations within their respective planes, as is shown in a second metablock 520 made up of blocks 522-528. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

Figure 6A:
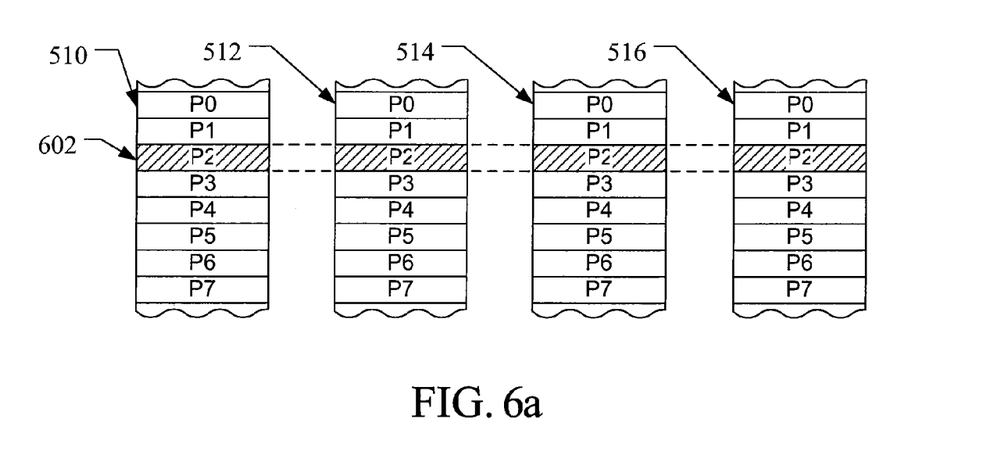
FIG. 6a shows an expanded view of a portion of the physical memory of FIG. 5.

The individual blocks are in turn divided for operational purposes into pages of memory cells, as illustrated in FIG. 6a. The memory cells of each of the blocks 510-516, for example, are each divided into eight pages P0-P7. Alternatively, there may be 32, 64 or more pages of memory cells within each block. The page is the unit of data programming and reading within a block, containing the minimum amount of data that are programmed or read at one time. In the NAND architecture of FIG. 3, a page is formed of memory cells along a word line within a block. However, in order to increase the memory system operational parallelism, such pages within two or more blocks may be logically linked into metapages. A metapage 602 is illustrated in FIG. 6a, being formed of one physical page from each of the four blocks 510-516. The metapage 602, for example, includes the page P2 in each of the four blocks but the pages of a metapage need not necessarily have the same relative position within each of the blocks.

In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

Figure 6B:
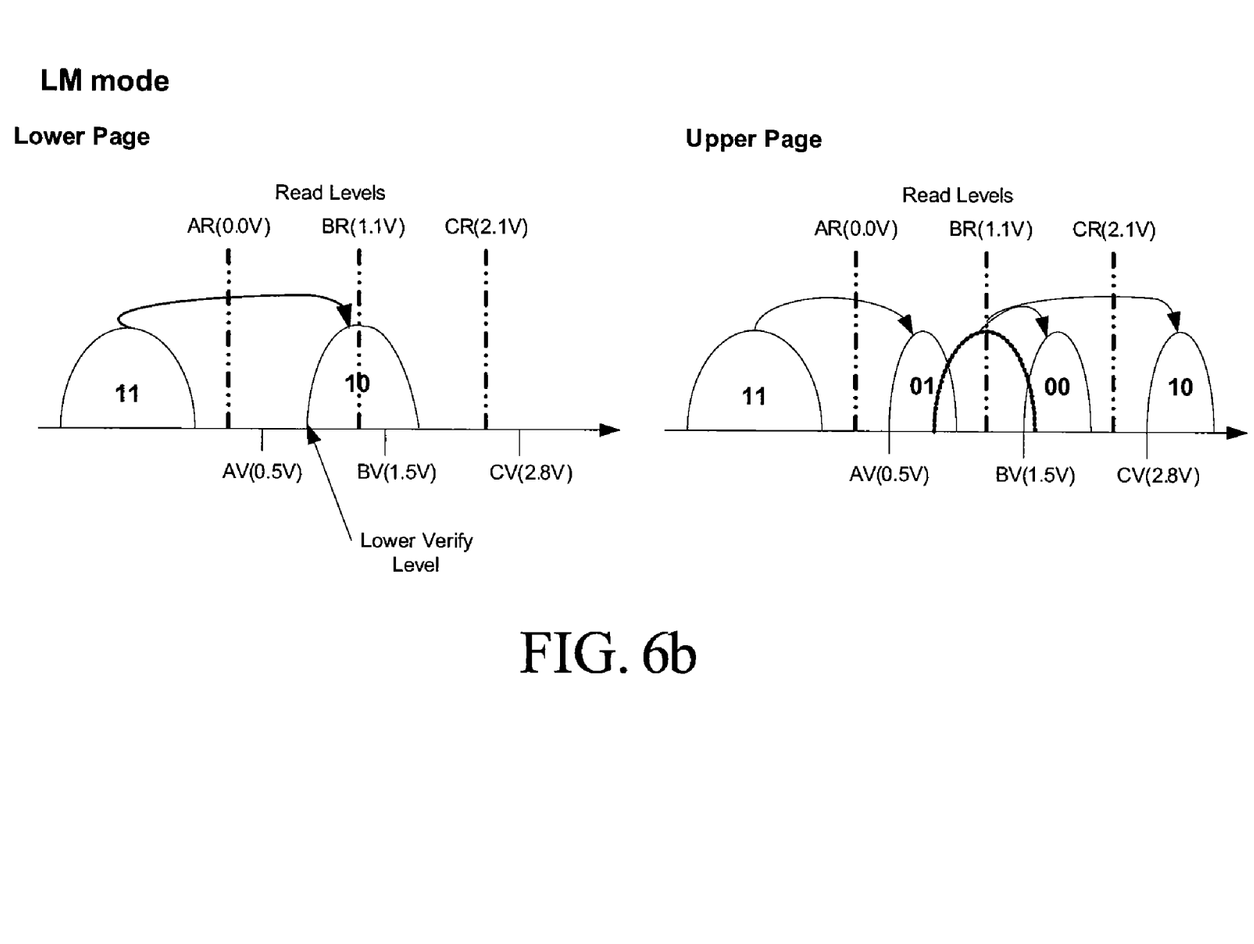
FIG. 6b illustrates charge levels in a MLC memory operated to store two bits of data in a memory cell.

FIG. 6b illustrates one implementation of the four charge levels used to represent two bits of data in a memory cell. A value of "11" corresponds to an un-programmed state of the memory cell. When programming pulses are applied to the memory cell to program a page bit of the lower page, the level of charge is increased to represent a value of "10" corresponding to a programmed state of the page bit of the lower page.

For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

Figure 7:
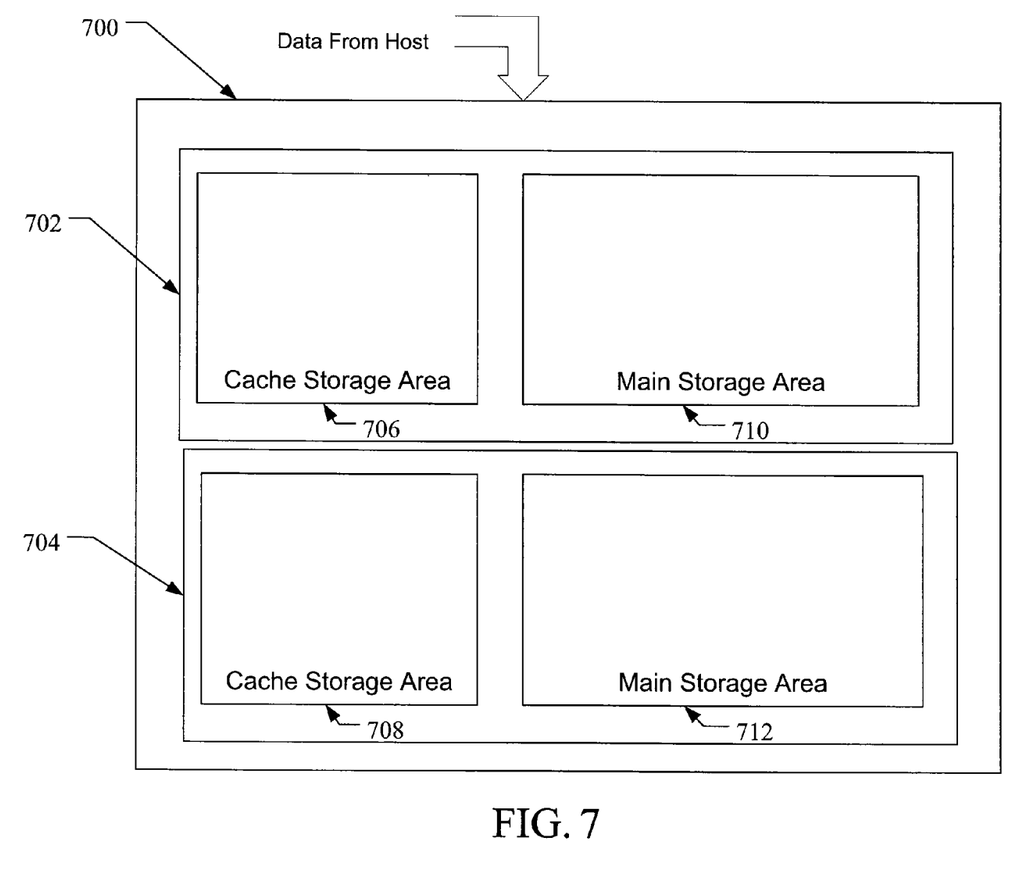
FIG. 7 illustrates a two die memory system.

FIG. 7 illustrates a memory 700 with two memory die 702, 704 each having a cache storage area 706, 708 and a main storage area 710, 712 arrangement that may be used to implement block interleaving. Block interleaving between multiple die such as die 702 and 704 in a flash memory 700 may be accomplished by writing sequentially addressed data received from a host to the cache storage area 706 of a first die 702 in flash memory. When an amount of sequentially addressed data has been written to the cache storage area 706 of the first die that is equal to a size of a page of memory in a main storage area 710 of the first die, the controller of the flash memory writes a next group of received data from the host that is sequentially addressed to cache storage blocks in the next memory die 704 of the flash memory. The writing of sequentially addressed data into the cache storage area 708 of the second die 704 continues until, as with the first die 702, an amount of the cache storage area 708 of the second die 704 equal to a page size of a block in the main storage area 712 of the second die 704 is filled.

For simplicity of illustration, a controller is not shown in FIG. 7, however the memory 700 of FIG. 7 may be associated with a discrete controller such as controller 118 shown in FIG. 2, may have one or more controllers integrated with the memory die on a single chip or may be configured to work with a combination of the two.

In traditional interleave programming sequences, system controllers of flash memory often sequentially write data to an upper page of Die 0, an upper page of Die 1, a lower page of Die 0, and then to a lower page of Die 1. The table below illustrates a traditional interleave programming sequence for an initial three transactions involving 64 Kilobytes of data using the programming sequence described above for the second and third 64K transactions. However, it will be appreciated that the traditional programming sequence may include any number of 64K transactions. The size of the USB transaction is 64 Kilobytes because a maximum USB transfer size is typically 64K. For a sequential write, a host device sends data over a USB to a memory device in multiples of 64K write transactions.

TABLE 1

Traditional Programming Sequence

| | | | | |
|---|---|---|---|---|
| 1st 64K Transaction | Die 0 Page 0 lower page | Die 1 Page 0 lower page | Die 0 Page 1 lower page | Die 1 Page 1 lower page |
| 2nd 64K Transaction | Die 0 Page 2 upper page | Die 1 Page 2 upper page | Die 0 Page 3 lower page | Die 1 Page 3 lower page |
| 3rd 64K Transaction | Die 0 Page 4 upper page | Die 1 Page 4 upper page | Die 0 Page 5 lower page | Die 1 Page 5 lower page |

In a die, a cache typically releases approximately 900 μs after a write to an upper page of the die and the cache typically releases approximately 20 μs after a write to a lower page of the die. Accordingly, when a system controller writes to a lower page of a die soon after writing to an upper page of the same die, the system controller often must wait a period of time to ensure that the cache releases. For example, in the second 64K transaction in the table above, assuming a data transfer time of 450 μs to write to an upper page of a die with a 30 MHz write clock, a system controller must wait approximately 450 μs after writing data to an upper page of Die 1 i.e. Page 2 to write data to a lower page of Die 0 i.e. Page 3 to ensure that the system controller does not write data to the lower page of Die 0 i.e. Page 3 less than 900 μs after writing data to the upper page of Die 0 i.e. Page 2. The data transfer time of 450 μs may be caused in part by delay in writing data due to, for example, scrambling.

Similarly, in the second 64K transaction in the table above, assuming a data transfer time of 300 μs to write data to a lower page of a die with a 30 MHz write clock, a system controller must wait approximately 150 μs after writing data to a lower page of Die 0 i.e. Page 3 to write data to a lower page of Die 1 i.e. Page 3 to ensure that the system controller does not write data to a lower page of Die 1 i.e. Page 3 less than 900 μs after writing data to an upper page of Die 1 i.e. Page 2. The data transfer time of 300 μs to write to a lower page of a die vs. a data transfer time of 450 μs to write to an upper page of a die may be the result of the absence of a delay in writing data because, for example, scrambling may already be accomplished and/or the data may be prepared to be written while the controller waits for the cache to release. The total transaction time for the second 64K transaction can be calculated as shown below.

TABLE 2

Total Time for 2nd 64K Transaction
Traditional Programming Sequence

| D0, P2 upper | D1, P2 upper | Wait | D0, P3 lower | Wait | D1, P3 lower | Total Time |
|---|---|---|---|---|---|---|
| 450 μs | + 450 μs | + 450 μs | + 300 μs | + 150 μs | + 300 μs | = 2100 μs |

Because the time for the cache to release after a write to a lower page of a die is approximately 20 μs rather than the approximate 900 μs for the cache to release after a write to an upper page of a die, in the systems and methods described in the present application, the programming sequence of the system controller may be modified to reduce the amount of time the system controller must wait for the cache to release during a transaction. The table below illustrates an initial three transactions in which a programming sequence has been modified to reduce the amount of time a system controller must wait for the cache to release during a transaction. However, it will be appreciated that the modified programming sequence may include any number of 64K transactions.

As shown below, during a 64K transaction other than the initial 64K transaction, the system controller initially writes data to an upper page of Die 0. The system controller then writes data to a lower page of Die 1 before proceeding to write data to an upper page of Die 1. Finally, the system controller writes data to a lower page of Die 0.

TABLE 3

Modified Programming Sequence

| | | | | |
|---|---|---|---|---|
| 1st 64K Transaction | Die 0 Page 0 lower page | Die 1 Page 0 lower page | Die 0 Page 1 lower page | Die 1 Page 1 lower page |
| 2nd 64K Transaction | Die 0 Page 2 upper page | Die 1 Page 3 lower page | Die 1 Page 2 upper page | Die 0 Page 3 lower page |
| 3rd 64K Transaction | Die 0 Page 4 upper page | Die 1 Page 5 lower page | Die 1 Page 4 upper page | Die 0 Page 5 lower page |

Similar to the example described above with a 30 MHz write clock, in some implementations a system controller takes 450 μs to write data to an upper page of a die and to write data to a lower page of a die. Accordingly, a system controller operating under the modified programming sequence to perform the second 64K transaction, for example, needs only to wait 20 μs after writing data to a lower page of Die 1 i.e. Page 3 to write data to an upper page of Die 1 i.e. Page 2 to ensure that the cache releases. The total transaction time for the second 64K transaction in the modified programming sequence can be calculated as shown below.

TABLE 4

Total Time for 2nd 64K Transaction
New Programming Sequence

| D0, P2 upper | D1, P3 lower | Wait | D1, P2 upper | D0, P3 lower | Total Time |
|---|---|---|---|---|---|
| 450 μs | +450 μs | +20 μs | +450 μs | +450 μs | =1820 μs |

Accordingly, by modifying the programming sequence to utilize the difference in time for a cache to release after a write to a lower page of a die (approximately 20 μs) versus the time for a cache to release after a write to an upper page of a die (approximate 900 μs), a system controller is able to complete a 64K transaction in 1820 μs using the modified programming sequence versus 2100 μs using the traditional programming sequence.

In another example, using a traditional programming sequence such as the traditional programming sequence illustrated in Table 1, when there is no delay between data, a data transfer time to write data to a page of a die is 280 μs. Accordingly, in order to execute the second 64K transaction in traditional programming sequence from Table 1, a system controller must wait approximately 620 μs after writing data to an upper page of Die 1 i.e. Page 2 to write data to a lower page of Die 0 i.e. Page 3 to ensure that the system controller does not write data to a lower page of Die 0 i.e. Page 3 less than 900 μs after writing data to an upper page of Die 0 i.e. Page 2. The total transaction time for the second 64K transaction can be calculated as shown below.

TABLE 5

Total Time for 2$^{nd}$ 64K Transaction - No Delay
Traditional Programming Sequence

| D0, P2 upper | D1, P2 upper | Wait | D0, P3 lower | D1, P3 lower | Total Time |
|---|---|---|---|---|---|
| 280 μs | +280 μs | +620 μs | +280 μs | +280 μs | =1740 μs |

Continuing with the example above where there is no delay between data, when a system controller executes a second 64K transaction of the modified programming sequence of Table 3, for example, the system controller needs to wait only 20 μs between writing data to a lower page of Die 1 i.e. Page 3 and writing data to an upper page of Die 1 i.e. Page 2. However, the system controller must wait approximately 320 μs after writing data to an upper page of Die 1 i.e. Page 2 to write data to a lower page of Die 0 i.e. Page 3 to ensure that the system controller does not write data to a lower page of Die 0 i.e. Page 3 less than 900 μs after writing data to an upper page of Die 0 i.e. Page 2. The total transaction time for the second 64K transaction can be calculated as shown below.

TABLE 6

Total Time for 2$^{nd}$ 64K Transaction - No Delay
Modified Programming Sequence

| D0, P2 upper | D1, P3 lower | Wait | D1, P2 upper | Wait | D0, P3 lower | Total Time |
|---|---|---|---|---|---|---|
| 280 μs | +280 μs | +20 μs | +280 μs | +320 μs | +280 μs | =1460 μs |

Accordingly, by modifying the programming sequence to utilize the difference in time for a cache to release after a write to a lower page of a die (approximately 20 μs) versus the time for a cache to release after a write to an upper page of a die (approximate 900 μs), a system controller is able to complete a 64K transaction with no delay between data in approximately 1460 μs using the modified programming sequence versus 1740 μs using the traditional programming sequence.

Figure 8A:
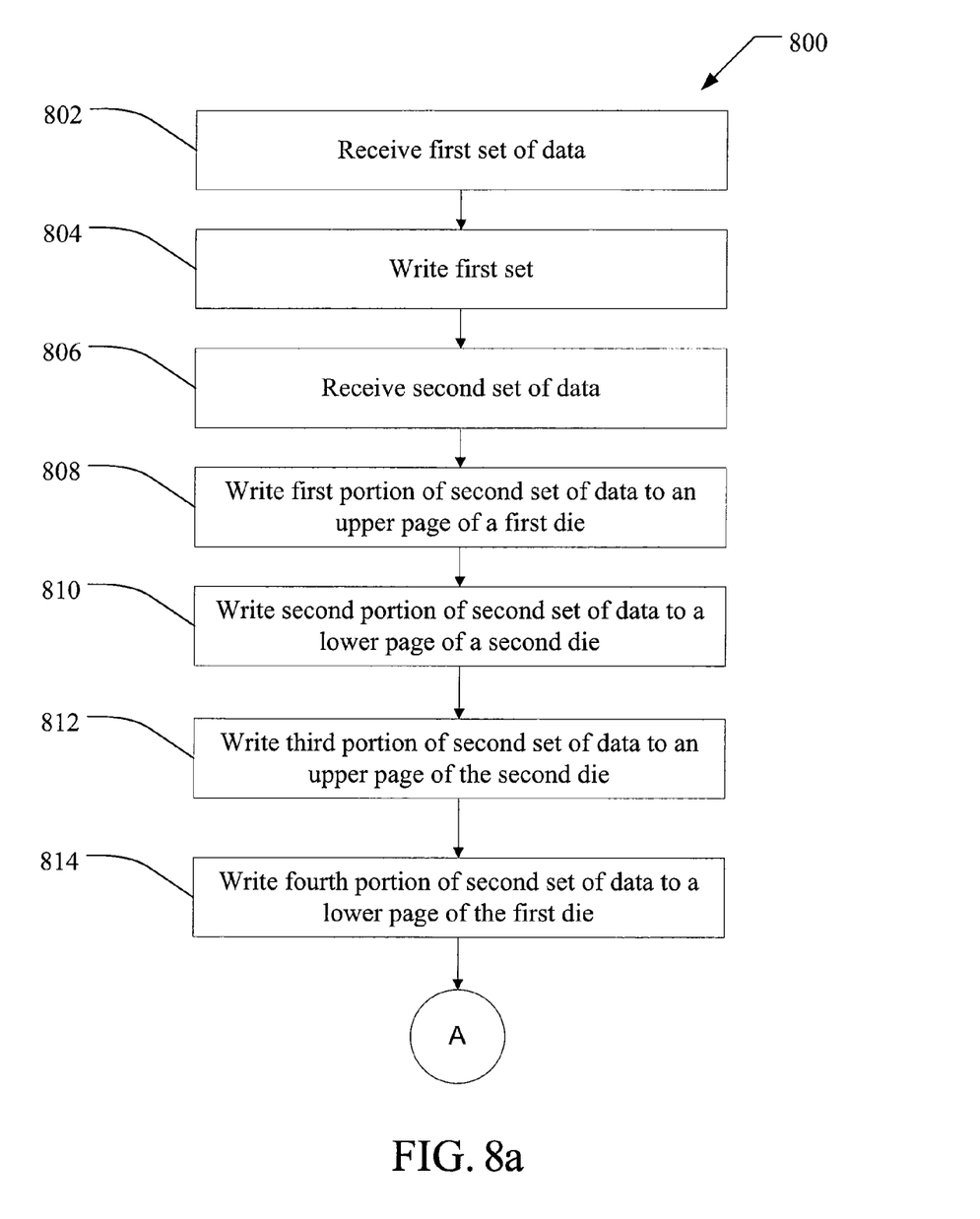
FIGS. 8a and 8b are a flow chart of a method for implementing a modified programming sequence for sequentially writing data to a memory device that reduces an amount of time that a system controller must wait for a cache to release while writing data to one or more pages of a first die and a second die.
Figure 8B:
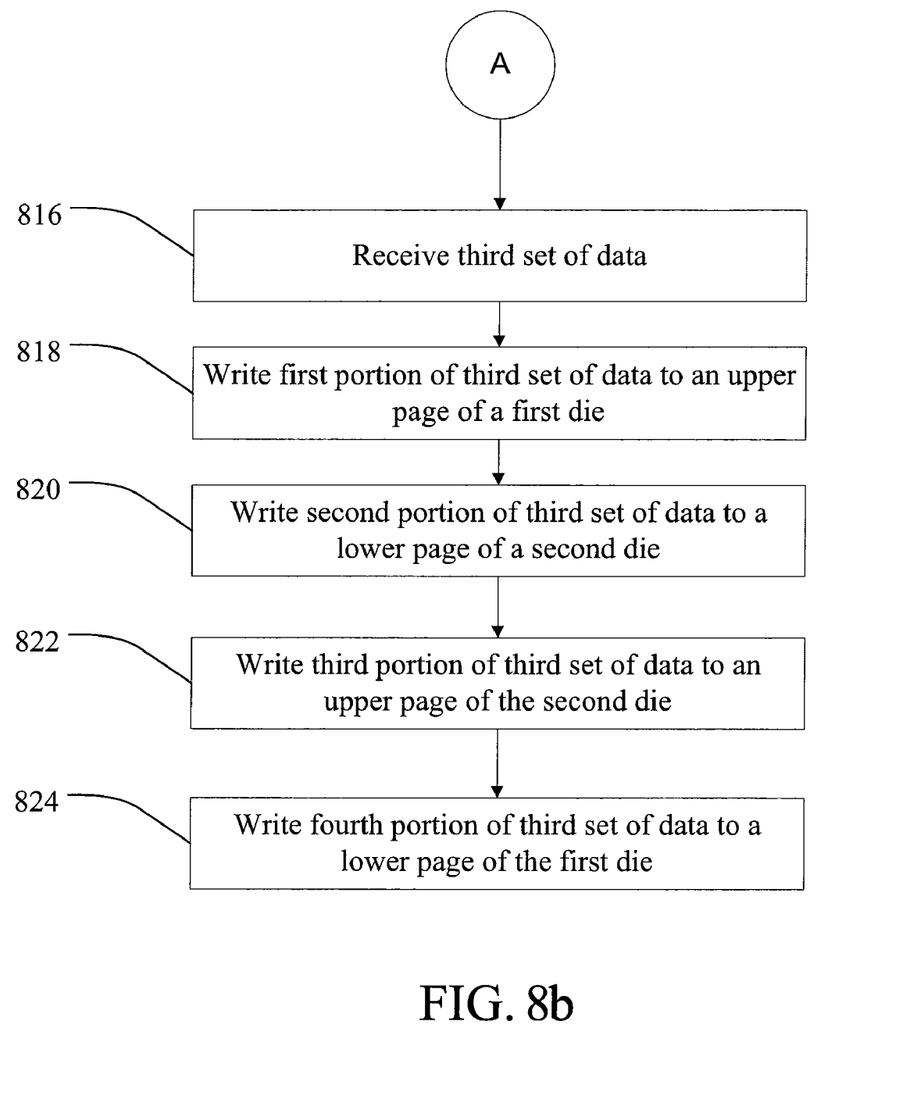

FIGS. 8a and 8b are a flow chart of a method for implementing a modified programming sequence for sequentially writing data to a memory device such as a universal serial bus (USB) memory device that reduces an amount of time that a system controller must wait while waiting for a cache to release while writing data to one or more pages of a first die and a second die. Each of the steps described below occurs in a memory device comprising a first die and a second die, where each of the first die and the second die include a plurality of pages.

The method 800 begins at step 802 with the memory device receiving a first set of data. In some implementations, the first set of data may be 64 kilobytes of data of a first 64K transaction that the memory device receives from a host device. The memory device writes the first set of data to one or more pages of the first die and the second die at step 804.

At step 806, the memory device receives a second set of data after writing the first set of data to the one or more pages of the first die and the second die. In some implementations, the second set of data may be 64 Kilobytes of data of a second 64K transaction. At step 808, the controller writes a first portion of the second set of data to an upper page of the first die. At step 810, the controller writes a second portion of the second set of data to a lower page of the second die after writing the first portion of the second set of data to the upper page of the first die.

At step 812, the controller writes a third portion of the second set of data to an upper page of the second die after writing the second portion of the second set of data to the lower page of the second die. At step 814, the controller writes a fourth portion of the second set of data to a lower page of the first die after writing the third portion of the second set of data to the upper page of the second die.

At step 816, the memory device receives a third set of data. At step 818, the controller writes a first portion of the third set of data to an upper page of the first die after writing the fourth portion of the second set of data to the lower page of the first die. At step 820, the controller writes a second portion of the third set of data to a lower page of the second die after writing the first portion of the third set of data to the upper page of the first die. At step 822, the controller writes a third portion of the third set of data to an upper page of the second die after writing the second portion of the third set of data to the lower page of the second die. At step 824, the controller writes a fourth portion of the third set of data to a lower page of the first die after writing the third portion of the third set of data to the upper page of the second die.

It will be appreciated that steps 816, 818, 820, 822, and 824 could be repeated for further 64K transactions using the modified programming sequence. For example, the memory device could receive a fourth set of data and write portions of the fourth set of data to upper and lower pages of the first and second die such that a portion of the fourth set of data is written to a lower page of a die prior to another portion of the fourth set of data being written to an upper page of the same die. Further, it will be appreciated that while the modified programming sequence has been described above with respect to a memory device receiving and writing data to upper and lower pages of first and second die, the same modified programming sequence can be used during garbage collection operations to write data already stored at the memory device to other upper and lower pages of the first and second die.

It is intended that the foregoing detailed description be understood as an illustration of selected forms that the invention can take and not as a definition of the invention. It is only the following claims, including all equivalents, which are intended to define the scope of this invention. Also, some of the following claims may state that a component is operative to perform a certain function or configured for a certain task. It should be noted that these are not restrictive limitations. It should also be noted that the acts recited in the claims can be performed in any order and not necessarily in the order in which they are recited.

What is claimed is:

1. A method for sequentially writing data to a memory device, the method comprising:
   in a memory device comprising a first die and a second die, each of the first die and the second die comprising a plurality of pages:
   receiving a first set of data;
   writing the first set of data to one or more pages of the first die and the second die;
   receiving a second set of data after writing the first set of data to the one or more pages of the first die and the second die;
   writing a first portion of the second set of data to an upper page of the first die;
   writing a second portion of the second set of data to a lower page of the second die after writing the first portion of the second set of data to the upper page of the first die;

writing a third portion of the second set of data to an upper page of the second die after writing the second portion of the second set of data to the lower page of the second die; and writing a fourth portion of the second set of data to a lower page of the first die after writing the third portion of the second set of data to the upper page of the second die.

2. The method of claim 1, wherein writing the fourth portion of the second set of data to the lower page of the first die after writing the third portion of the second set of data to the upper page of the second die comprises:

writing the fourth portion of the second set of data to the lower page of the first die approximately 320 µs after writing the third portion of the second set of data to the upper page of the second die.

3. The method of claim 1, wherein writing the fourth portion of the second set of data to the lower page of the first die after writing the third portion of the second set of data to the upper page of the second die comprises:

writing the fourth portion of the second set of data to the lower page of the first die immediately after writing the third portion of the second set of data to the upper page of the second die.

4. The method of claim 1, further comprising:

receiving a third set of data;

writing a first portion of the third set of data to a second upper page of the first die after writing the fourth portion of the second set of data to the lower page of the first die;

writing a second portion of the third set of data to a second lower page of the second die after writing the first portion of the third set of data to the second upper page of the first die;

writing a third portion of the third set of data to a second upper page of the second die after writing the second portion of the third set of data to the second lower page of the second die; and writing a fourth portion of the third set of data to a second lower page of the first die after writing the third portion of the third set of data to the second upper page of the second die.

5. The method of claim 1, wherein the first set of data is 64 Kilobytes of data and the second set of data is 64 Kilobytes of data.

6. The method of claim 1, wherein writing the third portion of the second set of data to the upper page of the second die after writing the second portion of the second set of data to the lower page of the second die comprises:

writing the third portion of the second set of data to the upper page of the second die approximately 20 µs after writing the second portion of the second set of data to the lower page of the second die.

7. A memory device comprising:

a communication interface;

a memory unit comprising a first die and a second die, each of the first die and the second die comprising a plurality of pages; and a processor for sequentially writing data received over the communication interface to one or more pages of the first die and the second die, the processor configured to:

receive a first set of data over the communication interface;

write the first set of data to the one or more pages of the first die and the second die;

receive a second set of data over the communication interface after writing the first set of data to the one or more pages of the first die and the second die;

write a first portion of the second set of data to an upper page of the first die;

write a second portion of the second set of data to a lower page of the second die after writing the first portion of the second set of data to the upper page of the first die;

write a third portion of the second set of data to an upper page of the second die after writing the second portion of the second set of data to the lower page of the second die; and write a fourth portion of the second set of data to a lower page of the first die after writing the third portion of the second set of data to the upper page of the second die.

8. The memory device of claim 7, wherein to write the fourth portion of the second set of data to the lower page of the first die after writing the third portion of the second set of data to the upper page of the second die, the processor is configured to:

write the fourth portion of the second set of data to the lower page of the first die approximately 320 µs after writing the third portion of the second set of data to the upper page of the second die.

9. The memory device of claim 7, wherein to write the fourth portion of the second set of data to the lower page of the first die after writing the third portion of the second set of data to the upper page of the second die, the processor is configured to:

write the fourth portion of the second set of data to the lower page of the first die immediately after writing the third portion of the second set of data to the upper page of the second die.

10. The memory device of claim 7, wherein the processor is further configured to:

receive a third set of data over the communication interface;

write a first portion of the third set of data to a second upper page of the first die after writing the fourth portion of the second set of data to the lower page of the first die;

write a second portion of the third set of data to a second lower page of the second die after writing the first portion of the third set of data to the second upper page of the first die;

write a third portion of the third set of data to a second an upper page of the second die after writing the second set portion of the third set of data to the second lower page of the second die; and write a fourth portion of the third set of data to a second lower page of the first die after writing the third portion of the third set of data to the second upper page of the second die.

11. The memory device of claim 7, wherein the first set of data is 64 Kilobytes of data and the second set of data is 64 Kilobytes of data.

12. The memory device of claim 7, wherein to write the third portion of the second set of data to the upper page of the second die after writing the second portion of the second set of data to the lower page of the second die, the processor is configured to:

write the third portion of the second set of data to the upper page of the second die approximately 20 µs after writing the second portion of the second set of data to the lower page of the second die.

* * * * *